United States Patent
Wu et al.

(10) Patent No.: US 7,235,482 B2
(45) Date of Patent: Jun. 26, 2007

(54) METHOD OF MANUFACTURING A CONTACT INTERCONNECTION LAYER CONTAINING A METAL AND NITROGEN BY ATOMIC LAYER DEPOSITION FOR DEEP SUB-MICRON SEMICONDUCTOR TECHNOLOGY

(75) Inventors: Chii-Ming Wu, Taipei (TW);
Ming-Hsing Tsai, Taipei (TW);
Ching-Hua Hsieh, Hsinchu (TW);
Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 152 days.

(21) Appl. No.: 10/657,505

(22) Filed: Sep. 8, 2003

(65) Prior Publication Data

US 2005/0054196 A1   Mar. 10, 2005

(51) Int. Cl.
*H01L 21/44* (2006.01)
(52) U.S. Cl. ............... 438/674; 438/685; 257/E21.168
(58) Field of Classification Search ............... 438/597, 438/674, 685, 758, 778, 785
See application file for complete search history.

(56) References Cited

U.S. PATENT DOCUMENTS

| | | | |
|---|---|---|---|
| 5,998,871 A | 12/1999 | Urabe | 257/754 |
| 6,037,252 A | 3/2000 | Hillman et al. | 438/637 |
| 6,139,700 A | 10/2000 | Kang et al. | 204/192.17 |
| 6,174,809 B1 | 1/2001 | Kang et al. | 438/682 |
| 6,203,613 B1 * | 3/2001 | Gates et al. | 117/104 |
| 6,270,572 B1 * | 8/2001 | Kim et al. | 117/93 |
| 6,391,785 B1 * | 5/2002 | Satta et al. | 438/704 |
| 6,399,491 B2 | 6/2002 | Jeon et al. | 438/680 |
| 6,468,924 B2 | 10/2002 | Lee et al. | 438/763 |
| 6,482,733 B2 * | 11/2002 | Raaijmakers et al. | 438/633 |
| 6,511,539 B1 * | 1/2003 | Raaijmakers | 117/102 |
| 6,605,549 B2 * | 8/2003 | Leu et al. | 438/758 |
| 6,653,199 B2 * | 11/2003 | Zheng | 438/398 |
| 6,767,582 B1 * | 7/2004 | Elers | 427/253 |
| 6,780,704 B1 * | 8/2004 | Raaijmakers et al. | 438/239 |
| 6,784,049 B2 * | 8/2004 | Vaartstra | 438/240 |
| 6,815,285 B2 * | 11/2004 | Choi et al. | 438/231 |
| 6,936,535 B2 * | 8/2005 | Kim et al. | 438/656 |
| 6,967,154 B2 * | 11/2005 | Meng et al. | 438/622 |
| 6,972,267 B2 * | 12/2005 | Cao et al. | 438/785 |
| 2001/0054769 A1 * | 12/2001 | Raaijmakers et al. | 257/758 |
| 2002/0135071 A1 * | 9/2002 | Kang et al. | 257/767 |

OTHER PUBLICATIONS

U.S. Appl. No. 10/653,852, filed Sep. 3, 2003, Assigned to a Common Assignee, "Method of Multi-Element Compound Deposition by Atomic Layer Deposition for IC Barrier Layer Applications".

* cited by examiner

*Primary Examiner*—Scott B. Geyer
(74) *Attorney, Agent, or Firm*—Haynes and Boone, LLP

(57) ABSTRACT

An atomic layer deposition method is used to deposit a TiN or TiSiN film having a thickness of about 50 nm or less on a substrat. A titanium precursor which is tetrakis(dimethylamido)titanium (TDMAT), tetrakis(diethylamido)titanium (TDEAT), or Ti{OCH(CH$_3$)$_2$}$_4$ avoids halide contamination from a titanium halide precursor and is safer to handle than a titanium nitrate. After a monolayer of the titanium precursor is deposited on a substrate, a nitrogen containing reactant is introduced to form a TiN monolayer which is followed by a second purge. For TiSiN, a silicon source gas is fed into the process chamber after the TiN monolayer formation. The process is repeated several times to produce a composite layer comprised of a plurality of monolayers that fills a contact hole. The ALD method is cost effective and affords an interconnect with lower impurity levels and better step coverage than conventional PECVD or CVD processes.

23 Claims, 6 Drawing Sheets

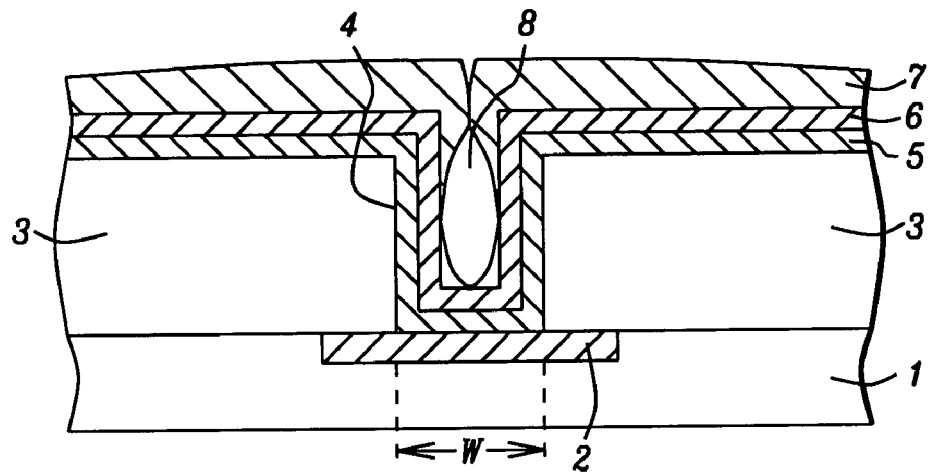
FIG. 1a – Prior Art
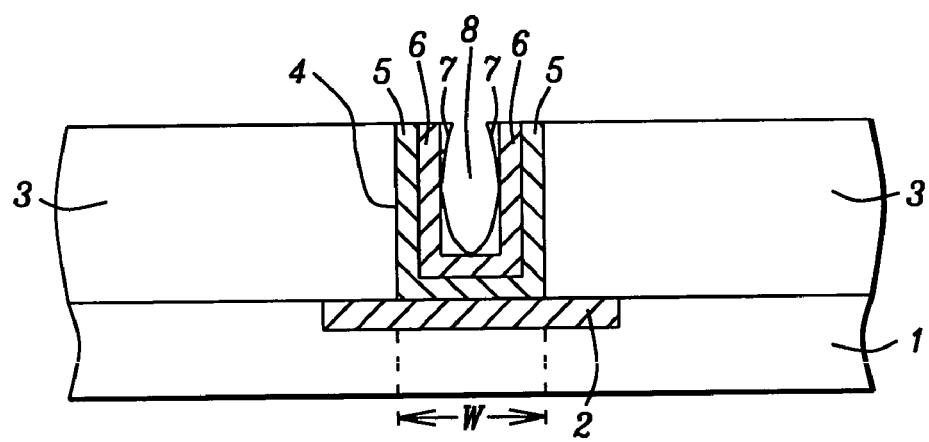
FIG. 1b – Prior Art

METHOD OF MANUFACTURING A CONTACT INTERCONNECTION LAYER CONTAINING A METAL AND NITROGEN BY ATOMIC LAYER DEPOSITION FOR DEEP SUB-MICRON SEMICONDUCTOR TECHNOLOGY

FIELD OF THE INVENTION

The invention relates to the field of fabricating integrated circuits and in particular to an improved method of forming a plug or interconnect that includes at least one metal and nitrogen with a diameter of less than about 100 nm.

BACKGROUND OF THE INVENTION

The formation of contact holes or vias is a critical process during the fabrication of semiconductor devices. Metal wiring in a device forms vertical and horizontal interconnections that are shrinking in size and increasing in complexity as technology advances to 100 nm ground rules and beyond. Current contact interconnect technology that has a 130 to 150 nm minimum feature size is typically based on a tungsten (W) plug that is formed by a chemical vapor deposition (CVD) comprising $H_2$ and $WF_6$ to produce a W layer that has good step coverage on a substrate. However, a Ti/TiN barrier layer is usually required to improve W adhesion to the substrate. Furthermore, a W nucleation layer is necessary to improve the W deposition process. Therefore, at least three deposition steps are employed in plug formation which adds complexity and cost to the device fabrication.

As depicted in FIG. 1a, a conventional plug formation process typically involves depositing a dielectric layer 3 on a substrate 1 containing a conductive layer 2. A contact hole 4 is patterned in dielectric layer 3. Next, a conformal Ti/TiN barrier layer 5 is deposited on dielectric layer 3 and within contact hole 4 by a CVD or plasma enhanced CVD (PECVD) method. A W nucleation layer 6 is then grown on the barrier layer 5 followed by CVD or PECVD deposition of a W layer 7 on nucleation layer 6.

Referring to FIG. 1b, a planarization step such as a chemical mechanical polish (CMP) process is used to lower the level of layers 5, 6, 7 so they are coplanar with the top of contact hole 4. In the case of a contact hole 4 that has a width w of about 100 nm or less, the conventional plug formation process does not adequately fill the contact hole 4. Note that an opening 8 still exists in contact hole 4 and this space is considered a defect that will degrade the performance of the final device. Therefore, an improved method is needed to fill a contact hole having a width of about 100 nm or less. Ideally, the most cost effective solution is a single material that can be deposited to completely fill the contact hole with good step coverage and without forming any voids.

A metal plug comprised of TiN is described in U.S. Pat. No. 5,998,871. The TiN plug is used as an interconnect from a polysilicon electrode to an underlying conductive layer and is placed between Ti silicide layers that serve to reduce the resistance in the device. The method of TiN deposition is not specified.

A TiN contact that is deposited by a one or two step CVD or plasma enhanced CVD process is mentioned in U.S. Pat. No. 6,037,252. A two step method is necessary to achieve a 100% conformal layer on the substrate. While this technique is successful for filling contacts with a diameter in the 130 to 150 nm range, a problem similar to that depicted in FIG. 1 is anticipated for filling holes that have a width of 100 nm or less.

Atomic layer deposition (ALD) is a newer approach to filling contacts that involves depositing a monolayer of precursor on a substrate, purging the chamber, and introducing a reactant that reacts with the precursor to leave a monolayer of product. The cycle is typically repeated many times to build a layer with a sufficient thickness to be functional. For example, in U.S. Pat. No. 6,203,613, a metal nitrate precursor such as $Ti(NO_3)_4$ is reduced with $NH_3$ to yield a 5 nm thick film of TiN after 167 cycles. A slightly modified ALD technique is described in U.S. Pat. No. 6,270,572 in which a precursor is injected twice to enable a more complete coverage of a substrate before a reactant is introduced into the ALD chamber. The reactant is then purged and reinjected to provide a precise stoichiometric composition. In this case a TiN film is grown at a rate of about 1 Angstrom per cycle using $TiCl_4$ as precursor and $NH_3$ as reactant. Using the same concept, a TiSiN thin film is formed by an ALD method in U.S. Pat. No. 6,468,924. Here, three different steps are used to introduce a Ti source gas, a N source gas and a Si source gas with a purge gas incorporated between each of the reactant gas pulses.

Since residual chloride is a contamination issue, an alternative means of introducing Ti into an ALD chamber is desirable. Although nitrates avoid the chloride contamination concern, they are highly flammable and explosive. Therefore, a Ti compound that is safer to handle than $Ti(NO_3)_4$ and which forms gaseous by-products is needed for an improved ALD method for filling small openings. In order to provide versatility in an interconnect scheme, alternative barrier layers containing a metal and nitrogen are needed. In some cases, a multi-element barrier layer could provide an advantage.

SUMMARY OF THE INVENTION

An objective of the present invention is to provide an improved method of forming a interconnect comprised of at least one metal and nitrogen that can be used as a plug with good step coverage in an opening which has a width of about 100 nm or less. It is desirable that the method should employ a precursor compound that is relatively safe to handle.

A further objective of the present invention is to provide a more cost effective means of forming an interconnect comprised of at least one metal and nitrogen that has a width of about 100 nm or less.

A still further objective of the present invention is to provide a method of forming an interconnect comprised of at least one metal and nitrogen that has a reduced impurity content.

Yet another objective of the present invention is to provide a method of forming a multi-element interconnect by an atomic layer deposition process to impart versatility into an interconnect fabrication scheme.

These objectives are achieved in a first embodiment by providing a substrate having an exposed conductive layer. A dielectric layer is deposited on the substrate by a CVD or PECVD method. Optionally, an etch stop layer is formed on the substrate before the dielectric layer is deposited. Typically, a photoresist is patterned on the dielectric layer and is used as a mask while the opening is transferred through the dielectric layer with a plasma etch to expose the conductive layer. The photoresist is removed to leave a contact hole or an opening in the dielectric layer that preferably has a width of about 100 nm or less. An ALD method is employed to deposit a composite layer comprised of a plurality of metal nitride monolayers that completely fills the opening and affords good step coverage. Preferably, the metal is Ti or Ta. When forming TiN, chloride contamination may be avoided by using tetrakis(dimethylamido)titanium (TDMAT), tetrakis(diethylamido)titanium (TDEAT), or Ti$\{OCH(CH_3)_2\}_4$ as the titanium precursor.

A nitrogen containing reactant gas such as $NH_3$ is flowed into an ALD chamber and the chamber is purged to leave a monolayer of nitrogen containing reactant on the substrate. The metal precursor is then fed into the chamber followed by purging with an inert gas. The metal precursor may or may not form a monolayer before reacting with the nitrogen containing reactant monolayer to afford a monolayer of metal nitride. Another purge with an inert gas completes one cycle. A plurality of cycles are required to deposit a thin layer of metal nitride that can be up to 50 nm thick. The level of the metal nitride layer is lowered by a planarization process such as a chemical mechanical polish (CMP) step to form a metal nitride plug that is coplanar with the top of the contact or opening. Optionally, the metal nitride layer is lowered by a plasma etch process. Thus, the interconnect is a composite layer comprised of a single material such as TiN or TaN that is deposited in one continuous ALD process. A single deposition step is more cost effective than prior art methods that involve two or three steps.

In a second embodiment, an ALD approach is followed to form a composite layer that includes a plurality of monolayers in an opening that is comprised of three elements which include a metal, nitrogen, and a third element that is B or Si. The composite layer has the formula $M_V(S)_X N_Z$ where v, x, and z are fractions between 0 and 1 and which together equal 1, and S is Si or B. A cycle may consist of forming a monolayer that contains all three elements or optionally a cycle involves forming only a MN or an M(Si,B) monolayer. A plurality of cycles is performed in a predetermined order to yield a composite layer having a desired composition that fills the opening. The composite layer is then planarized as described in the first embodiment to form an interconnect. The second embodiment is useful in forming a composite layer such as TiSiN or TaSiN.

In a third embodiment, an ALD approach is used to form a composite layer that includes a plurality of monolayers in an opening. The composite layer is comprised of four elements and has the formula $M_{1V} M_{2W} S_X N_Z$ where v, w, x and z are fractions between 0 and 1 and which together equal 1, $M_1$ is a first metal, $M_2$ is a second metal, and S is Si or B. Optionally, the composite layer has the formula $M_{1V} Si_X B_Y N_Z$ where v, x, y and z are fractions between 0 and 1 which together equal 1 and $M_1$ is preferably Ti or Ta. A cycle consists of forming a monolayer that contains either two or three elements including a metal. In one embodiment, at least one cycle is performed to produce a $M_1$ SN, $M_1$S, or $M_1$N monolayer and at least one cycle is performed to yield a $M_1$BN or $M_1$B monolayer. In another embodiment, at least one cycle is performed to generate an $M_1$ SN, $M_1$ S, or $M_1$N monolayer and at least one cycle is performed to produce an $M_2$SN, $M_2$S, or $M_2$N monolayer. Alternatively, at least one cycle is performed to yield an $M_1$BN, $M_1$B, or $M_1$N monolayer and at least one cycle is performed to produce an $M_2$BN, $M_2$B, or $M_2$N monolayer. A plurality of cycles is performed in a predetermined order to afford a composite layer with the desired composition that fills an opening such as a via.

BRIEF DESCRIPTION OF THE DRAWINGS

The features and advantages of a semiconductor device according to the present invention and further details of a process of fabricating such a device in accordance with the present invention will be more clearly understood from the following description taken in conjunction with the accompanying drawings in which like reference numerals designate similar or corresponding elements, regions, and portions and in which:

FIGS. 1a and 1b are cross-sectional views depicting a metal interconnect that is fabricated with a conventional method and contains a TiN barrier layer, a nucleation layer, and a tungsten plug.

DETAILED DESCRIPTION OF THE INVENTION

The present invention is an ALD method that is particularly useful for depositing a plurality of monolayers in an opening formed in a layer on a substrate where the opening is a small contact hole or via that has a width of about 100 nm or less. The plurality of monolayers form a composite layer with two or more elements comprised of at least one metal and nitrogen that is subsequently planarized to fabricate an interconnect or plug. However, the ALD method can also be used to fill other openings such as a trench. In a first embodiment, an ALD method is employed that produces a metal nitride plug with good step coverage, low impurity content, and which does not form any voids.

Figure 2A:
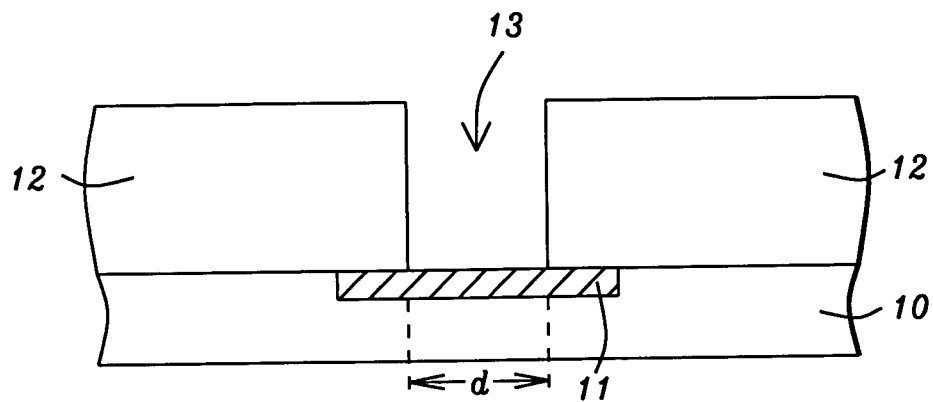
FIGS. 2a-2c are cross-sectional views showing the formation of an interconnect comprised of a metal and nitrogen according to the first embodiment of the present invention.

Referring to FIG. 2a, a substrate 10 is provided which is typically silicon but may be based on silicon-germanium, gallium arsenide, or silicon-on-insulator technology. The substrate 10 contains a conductive layer 11 that has an exposed upper surface which is coplanar with the top surface of the substrate. Conductive layer 11 may be tungsten, copper, or aluminum or an Al/Cu alloy. Furthermore, substrate 10 may contain active and passive devices as well as conductive and dielectric layers that are not shown in order to simplify the drawing.

A dielectric layer 12 is deposited by a CVD, PECVD, or spin-on technique on substrate 10 and has a thickness from about 1000 to 10000 Angstroms. Dielectric layer 12 is preferably phosphosilicate glass (PSG) or borophosphosilicate glass (BPSG) but may be comprised of a low k dielectric material such as carbon doped silicon oxide, fluorine doped $SiO_2$, a polysilsesquioxane, a polyarylether, or benzocyclobutene. Optionally, an etch stop layer (not shown) such as silicon carbide, silicon nitride, or silicon oxynitride is formed on substrate 10 prior to depositing dielectric layer 12.

An opening 13 is formed by a conventional method that usually involves coating a photoresist layer (not shown) on dielectric layer 12 and patterning the photoresist layer with a lithography technique that includes a mask, exposure system, and a process tool for developing the pattern. A plasma etch step then transfers the opening 13 through the exposed dielectric layer 12 while the photoresist serves as a mask to protect dielectric layer 12 that has not been uncovered by the photoresist pattern. Care must be taken not to overetch beyond the end point of the etch process so as to avoid damaging the underlying conductive layer 11. Alternatively, when an etch stop layer is employed, a first etch step is typically used to etch the dielectric layer 12 and a second etch step with milder conditions may be followed to remove the etch stop layer that protects the conductive layer 11. The remaining photoresist layer is removed by a wet stripper solution or with a plasma ashing technique. Typically, the substrate 10 is cleaned to remove any residues following removal of the photoresist. As a result, the opening 13 which has a width d that is about 100 nm or less is produced in dielectric layer 12. Preferably, the opening 13 is aligned above conductive layer 11 and does not overlap on substrate 10.

A key feature of the present invention is deposition of a plug comprised of a metal and nitrogen to fill the opening 13 in a single continuous ALD process. Conventional CVD or PECVD methods require deposition of two or three different materials and often leave a void or keyhole in the plug as shown in FIG. 1b. Prior art ALD methods for forming TiN involve a titanium precursor such as $Ti(NO_3)_4$ that can be explosive. $TiCl_4$ is not preferred as a precursor since its use can result in chloride residues that contaminate the final device. The inventors have found that an alternative titanium precursor can be employed which mitigates the hazard issue of nitrate precursors and avoids contamination from halide precursors. Alternatively, tert-butylimino-tris(diethylamino) tantalum also known as TBTDET may be used in place of $TaCl_5$ as a metal precursor to lower the risk of halide contamination when depositing a TaN layer.

Figure 3:
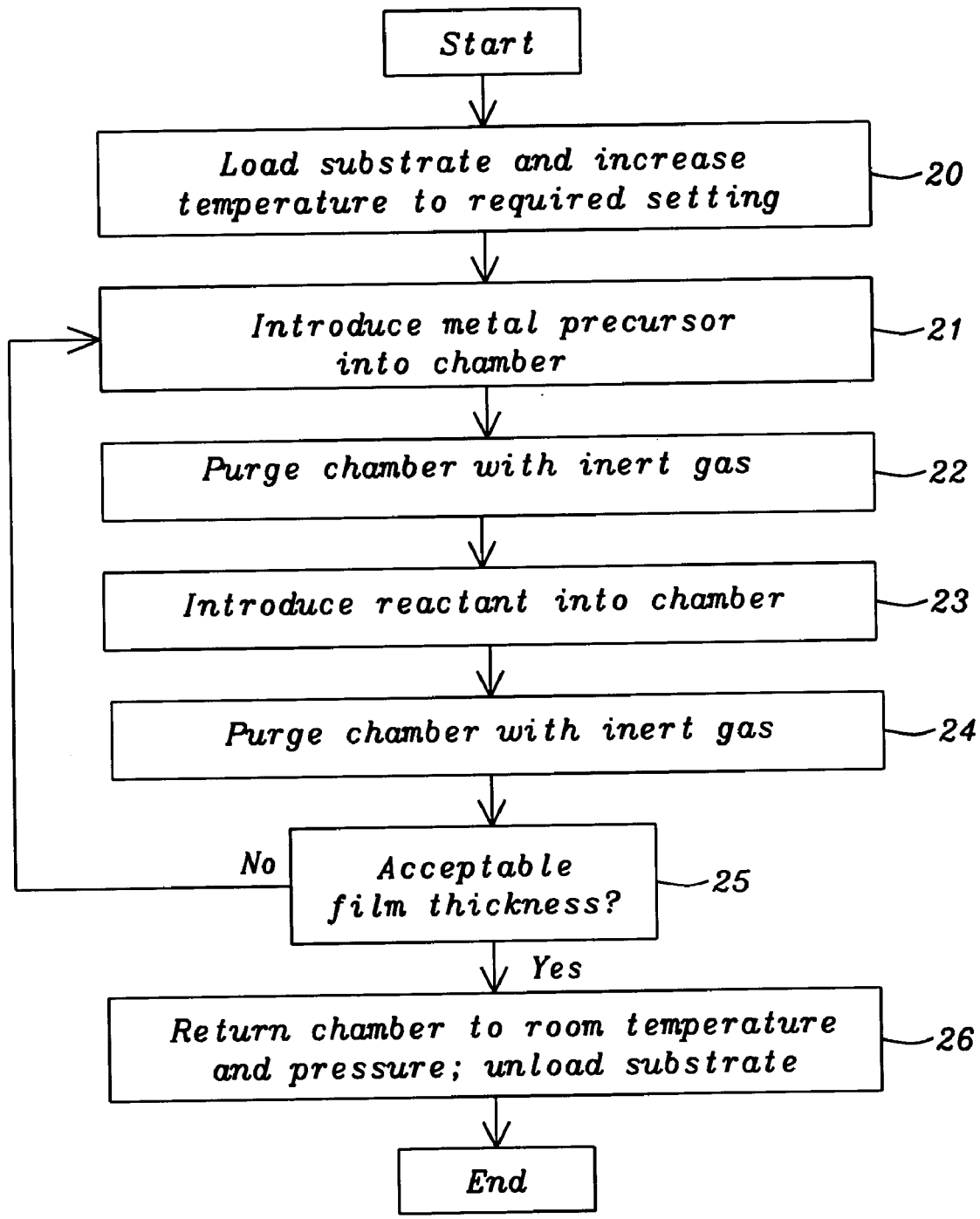
FIG. 3 is a flow diagram that depicts the various steps in the ALD process of the first embodiment.

In one embodiment, the ALD process deposits a composite layer that includes a plurality of monolayers comprised of a metal and nitrogen. Referring to FIG. 3, the ALD process of the present invention is depicted in a flow diagram. In step 20, a substrate 10 having a dielectric layer 12 with an opening 13 as represented in FIG. 2a is positioned on a chuck in an ALD process chamber. The process chamber may be part of a Centura tool which is available from Applied Materials or another ALD process chamber with similar capability. A vacuum is then applied to the process chamber to remove oxygen and moisture and the temperature is raised to an acceptable level that is required for the ALD deposition. Preferably, the temperature is increased to a range of about 250° C. to 750° C. and the pressure is maintained at about 0.1 Torr to 50 Torr.

In step 21, a metal precursor is typically fed into the reactor by an injection through a nozzle or a shower head. In the simplest case where no previous injections have occurred, the metal precursor forms a conformal monolayer on dielectric layer 12 and on conductive layer 11 that is exposed by the opening 13. In one embodiment, the metal is Ti and the precursor is $Ti\{OCH(CH_3)_2\}_4$, tetrakis(dimethylamido)titanium (TDMAT), or tetrakis(diethylamido)titanium (TDEAT). Optionally, $TiCl_4$ which is less preferred may be used in step 21. The duration of the injection is usually from about 0.1 to 3 seconds. When the titanium precursor is a liquid, an inert carrier gas such as argon or helium is used to transport the Ti precursor as a gas into the chamber. For example, when $Ti\{OCH(CH_3)_2\}_4$ is employed as the precursor, then a flow rate of 500 to 10000 standard cubic centimeters per minute (sccm) of argon may be used to transport the Ti precursor into the ALD chamber. In this case, a total flow rate of between 1000 and 3000 sccm of argon and $Ti\{OCH(CH_3)_2\}_4$ is preferably fed into the chamber during step 21. In another embodiment, the metal is Ta and TBTDET is the precursor compound. Optionally, $TaCl_5$ which is less preferred is the precursor compound.

During step 22, a purge gas such as argon, helium, or $N_2$ is fed into the chamber to remove the metal precursor that is not physically bonded to the substrate which is understood to mean conductive layer 11 and dielectric layer 12. For instance, where the thickness of the metal precursor film exceeds a monolayer, then only the molecules that are in the monolayer which is in intimate contact with the conductive layer 11 or dielectric layer 12 remain after the purge. All other precursor molecules are swept away in the purge which has a duration of about 0.1 to 10 seconds and consists of an inert gas flow rate of between 500 and 10000 scam.

Referring to step 23, a nitrogen containing reactant is now flowed into the ALD process chamber. When a metal precursor monolayer is on the substrate, the nitrogen containing reactant reacts to form a metal nitride monolayer. Commonly used nitrogen containing reactants are $NH_3$, $N_2H_4$, or $N_2$. The nitrogen containing reactant is fed into the chamber at a flow rate from about 500 to 10000 sccm for a period of 0.1 to 3 seconds. The elevated temperature set during step 20 is maintained through steps 21, 22, 23 and facilitates a fast reaction between the metal precursor and nitrogen containing reactant to form a metal monolayer, preferably TiN or TaN, that is about 1 to 5 Angstroms thick. Optionally, the reaction between the metal precursor monolayer and nitrogen containing reactant may be assisted by a plasma using conditions known to those skilled in the art.

During step 24, the inert gas that was used in step 22 is again fed into the ALD process chamber to sweep away any molecules of the nitrogen containing reactant that have not reacted with the metal precursor. The duration of this step is about 0.1 to 3 seconds and consists of the same flow rate of inert gas that was employed in step 22.

Figure 2B:
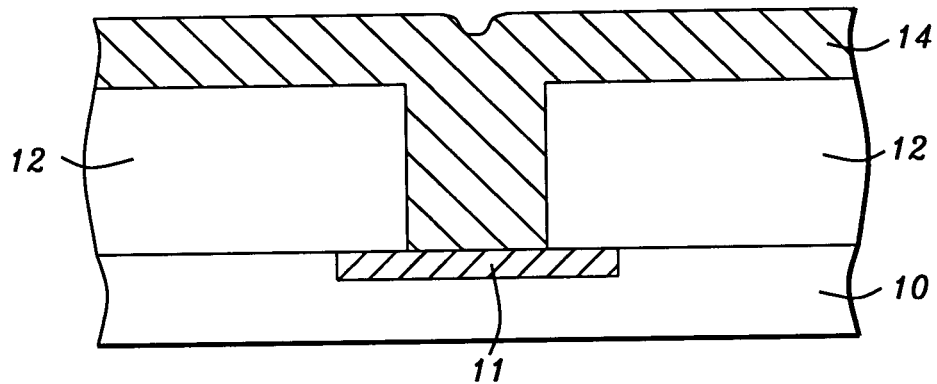

The sequence of steps 21, 22, 23, 24 is called a cycle and is repeated as many times as necessary in order to achieve the desired thickness of metal nitride layer 14 which fills the opening 13 as depicted in FIG. 2b. Hundreds of cycles may be required since each cycle accounts for only a monolayer of metal nitride thickness. For example, if the opening 13 has a width of 90 nm, then the sequence of steps 21, 22, 23, 24 is repeated until a 45 nm thick TiN film is deposited. Note that in subsequent cycles after the first cycle, purging the metal precursor in step 22 is understood to mean the removal of any metal precursor that is not physically bonded to an underlying metal nitride monolayer. Film thickness of metal nitride layer 14 may be determined by a top-down measurement tool such as XRF that is available from Rigaku Company.

In an alternative embodiment, step 23 is performed first in a first cycle to deposit a monolayer of a nitrogen containing reactant on dielectric layer 12 and on conductive layer 11. In subsequent cycles, a nitrogen containing reactant monolayer is deposited in a step 23 on a metal nitride layer formed in a previous cycle. A purge step 24 is used to remove nitrogen containing reactant that is not physically bonded to the dielectric layer 12, conductive layer 11, or an underlying metal nitride monolayer. Then step 21 introduces a metal precursor into the ALD process chamber. In this case, the metal precursor reacts with the nitrogen containing reactant monolayer to afford a monolayer of metal nitride. Step 22 which is a purge step completes one cycle. A plurality of cycles comprised of the sequence of steps 23, 24, 21, 22 is performed to deposit a composite metal nitride layer 14 that is comprised of a plurality of metal nitride monolayers in opening 13. Obviously, yet another embodiment is possible in which at least one sequence of steps 21, 22, 23, 24 and at least one sequence of steps 23, 24, 21, 22 is performed during the plurality of cycles to deposit a metal nitride layer 14.

Returning to FIG. 3, step 25 involves a film thickness measurement that may occur after a certain number of cycles are completed. In a manufacturing process, the metal nitride deposition rate is typically well known and a film thickness measurement may be taken after a predetermined number of cycles that are expected to provide the correct thickness. If the measurement indicates that the metal nitride layer 14 is too thin, then the sequence of steps 21, 22, 23, 24 or the sequence of steps 22, 21, 23, 24 is repeated one or more times and a second measurement (step 25) is performed to verify that the metal nitride layer 14 has an acceptable thickness. Generally, the computer which controls the ALD process chamber also records the completion of each cycle during the ALD process and a film thickness measurement may not be needed when a predetermined number of cycles are performed to deposit a known thickness of the metal nitride layer 14.

Once metal nitride layer 14 has an appropriate thickness as determined by a film thickness measurement or by recording the number of completed cycles, the ALD process moves to step 26 in which the ALD process chamber is returned to room temperature and atmospheric pressure. The substrate 10 is removed and the ALD process is concluded. The resulting structure as shown in FIG. 2b has a metal nitride layer 14 that does not have any voids and is completely conformal with the surface of dielectric layer 12 and opening 13. A small dip in the metal nitride layer 14 above the center of the opening 13 does not affect device performance since it is removed in a subsequent step. This ALD technique is preferred over CVD or PECVD methods since a precise stoichiometry is achieved in the metal nitride layer 14 with a reduced amount of impurities that improves device performance. Moreover, the need for two or three different materials to form a plug in the opening 13 is avoided which reduces process complexity and cost. The ALD method of the present invention is preferred over prior art ALD techniques because it avoids the use of hazardous titanium nitrate precursors and does not require $TiCl_4$ that could result in chloride contamination.

Figure 2C:
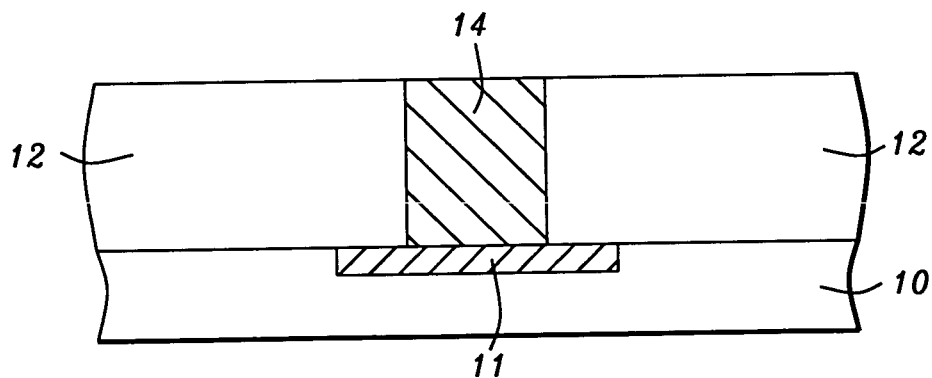

Referring to FIG. 2c, the level of metal nitride layer 14 is lowered until it is coplanar with dielectric layer 13 and forms a metal nitride plug 14. A planarization method such as a CMP step known to those skilled in the art may be employed. Optionally, the metal nitride layer 14 may be etched back by a plasma etch process that consists of the following conditions: a gas mixture comprised of $Cl_2$, $BCl_3$ and Ar, each with a 10 to 100 sccm flow rate, a chamber pressure of about 1 to 50 Torr, a chamber temperature of 20° C. to 100° C., a RF power of from 100 to 2000 Watts for a period of about 5 to 60 seconds. Other gas mixtures known to those skilled in the art may be used depending on the composition of the metal nitride layer 14.

A metal nitride plug (interconnect) is therefore constructed which is cost effective since the deposition involves only a single ALD process. Less rework is required than in the case of a two or three step CVD or PECVD deposition where adhesion failure of the metal plug is a concern and a keyhole is likely to form in the center of the plug. Furthermore, step coverage is improved in an ALD process compared to a conventional W plug process that has a barrier layer and nucleation layer as illustrated in FIG. 1a.

In a second embodiment, the ALD process deposits a composite layer comprised of a plurality of monolayers that include a metal, nitrogen, and a third element that is Si or B. The invention is especially useful for fabricating a composite layer that fills a contact hole or an opening which has a width of about 100 nm or less.

Figure 4A:
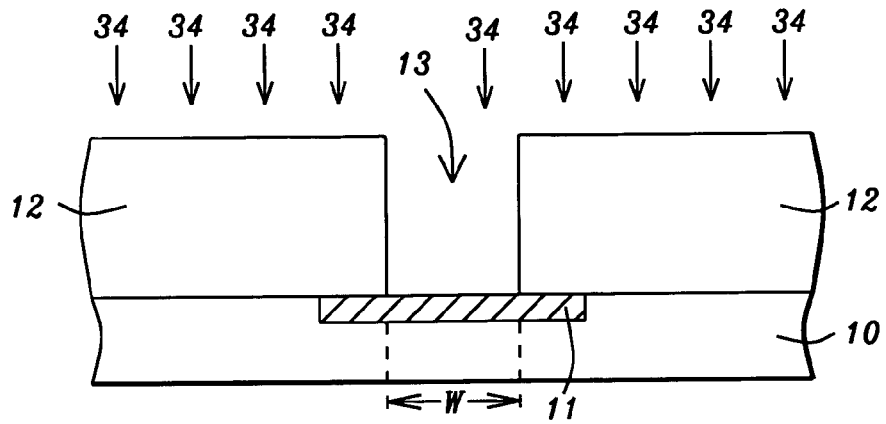
FIGS. 4a-4f are cross-sectional views showing the formation of an interconnect comprised of three elements in accordance with the second embodiment of the present invention.
Figure 5:
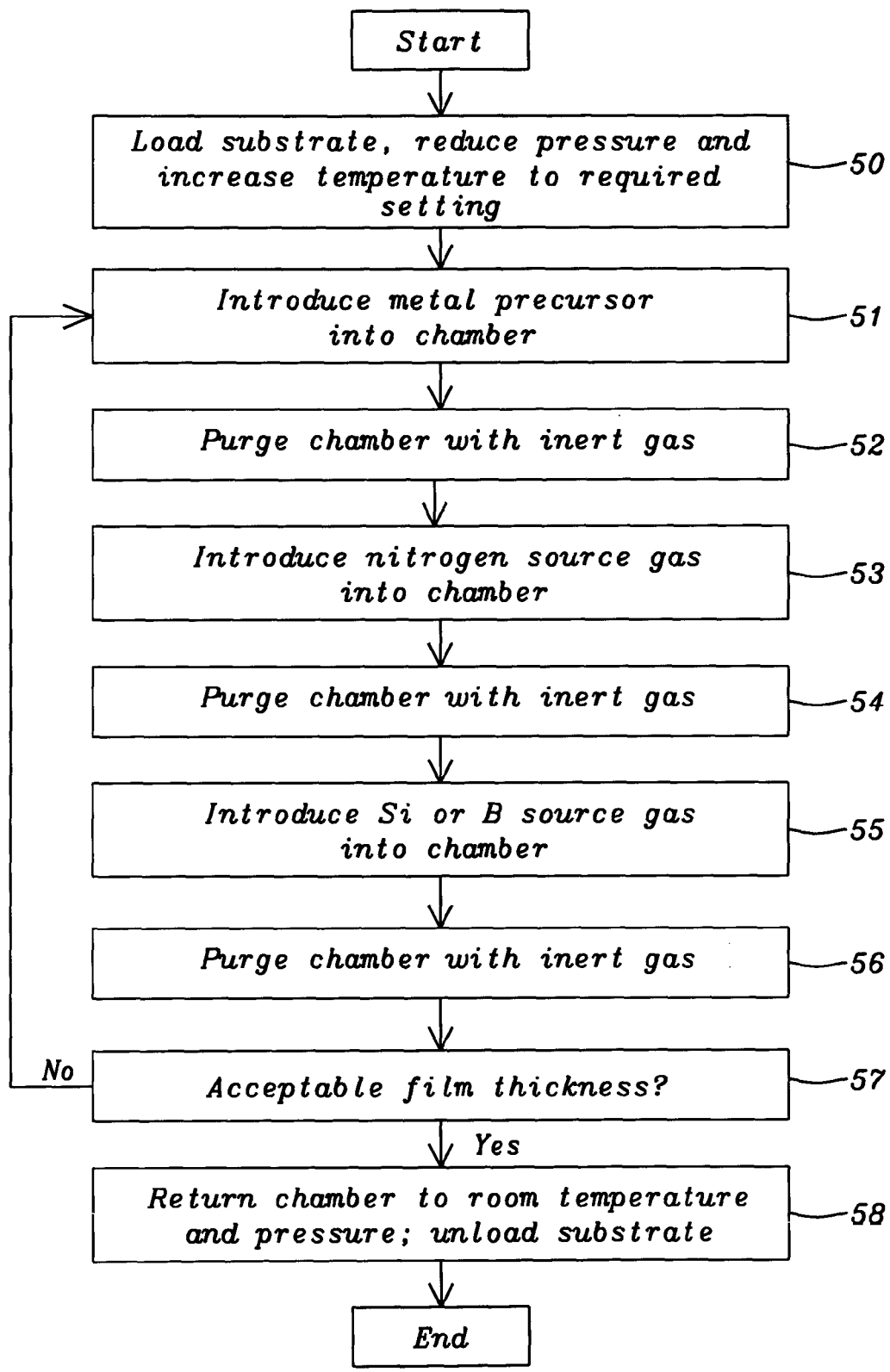
FIG. 5 is a flow diagram that depicts the various steps in the ALD process of the second embodiment.

Referring to FIG. 5, the ALD process of the present invention is depicted in a flow diagram. In step 50, a substrate 10 having a dielectric layer 12 containing an opening 13 as represented in FIG. 4a is positioned on a chuck in an ALD process chamber (not shown) as described in the first embodiment. A vacuum is then applied to the ALD process chamber to remove oxygen and moisture and the temperature is raised to an acceptable level that is required for the ALD deposition. Preferably, the temperature is increased to a range from about 250° C. to 750° C. and the pressure is maintained at about 0.1 Torr to 50 Torr.

In step 51 which is represented by a cross-sectional view in FIG. 4a, a metal precursor 34 is typically fed into the reactor by an injection through a nozzle or a shower head (not shown). In one embodiment, the metal is Ti and the precursor 34 is $Ti\{OCH(CH_3)_2\}_4$, TDMAT, TDEAT. Optionally, $TiCl_4$ which is less preferred may be used in step 51. The duration of the injection is usually from about 0.1 to 3 seconds. When the metal precursor 34 is stored as a liquid in a source vessel that is connected to the chamber by a valve, then an inert carrier gas such as argon or helium is used to transport the metal precursor 34 into the ALD process chamber. For example, when $Ti\{OCH(CH_3)_2\}_4$ is employed as the metal precursor 34, then a flow rate of 500 to 10000 sccm of argon may be used to transport the metal precursor 34 into the ALD process chamber. In this case, a total flow rate of between 1000 and 3000 sccm of Ar and $Ti\{OCH(CH_3)_2\}_4$ is preferably fed into the ALD process chamber during step 51. In another embodiment, the metal is Ta and TBTDET is the metal precursor 34. Optionally, $TaCl_5$ which is less preferred is the metal precursor 34. During a first cycle, the metal precursor 34 forms a monolayer on a substrate which is understood to be dielectric layer 12 and conductive layer 11. During subsequent cycles, the metal precursor 34 forms a monolayer on a substrate comprised of a metal nitride monolayer.

During step 52, a purge gas such as argon, helium, or $N_2$ is fed into the ALD process chamber to remove the metal precursor that is not physically bonded to the conductive layer 11, dielectric layer 12, or to an underlying monolayer in a subsequent cycle. For instance, where the thickness of the deposited metal precursor film exceeds a monolayer, then only the metal precursor molecules that are in the monolayer which is in intimate contact with the dielectric layer 12, conductive layer 11, or an underlying monolayer remain on the substrate 10 after the purge. All other metal precursor molecules are swept away in the purge which has a duration of about 0.1 to 10 seconds and includes an inert gas flow rate of between 500 and 10000 sccm.

Figure 4B:
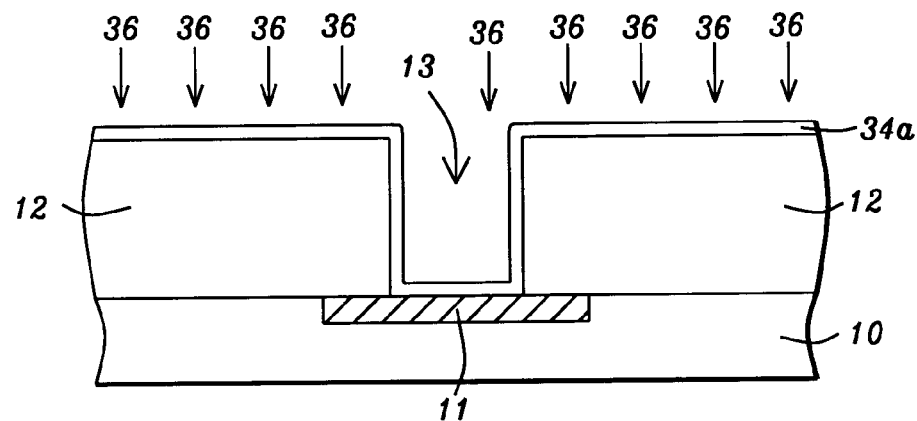

Referring to FIG. 4b, a monolayer 34a of the metal precursor remains on the surface and sidewalls of dielectric layer 12 and on exposed conductive layer 11 in a first cycle. At this point, a nitrogen containing reactant 36 is fed into the ALD process chamber. This step is shown as step 53 in FIG. 5. Note that the elevated temperature set during step 50 is maintained through steps 51-56 and facilitates a fast reaction between the metal precursor monolayer 34a and nitrogen containing reactant 36 that forms a metal nitride monolayer. Commonly used nitrogen containing reactants are $NH_3$, $N_2H_4$, or $N_2$. The nitrogen containing reactant 36 is fed into the chamber at a flow rate from about 500 to 10000 sccm for a period of 0.1 to 3 seconds. Optionally, the reaction between the metal precursor monolayer 34a and nitrogen containing reactant 36 may be assisted by a plasma using conditions known to those skilled in the art.

Figure 4C:
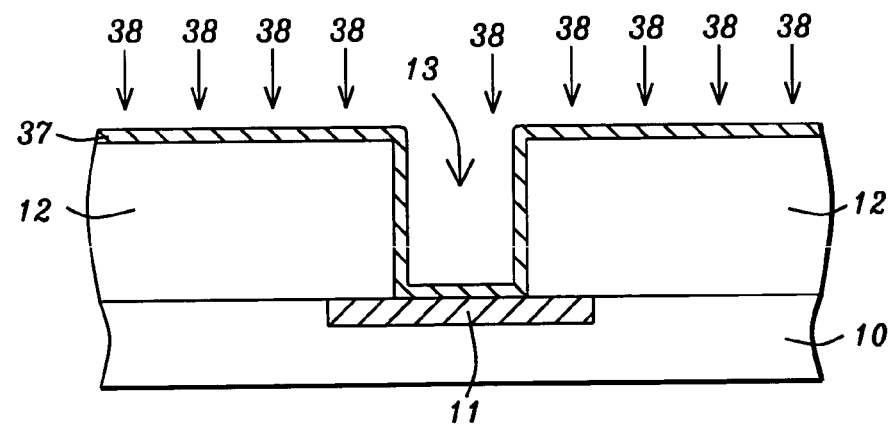

Referring to FIG. 4c, the resulting metal nitride monolayer 37 is about 1 to 5 Angstroms thick. Returning to FIG. 5, an inert gas that was used in step 52 is again fed into the ALD process chamber in step 54 to sweep away any molecules of the nitrogen containing reactant 36 that have not reacted with the metal precursor 34. The duration of step 54 is about 0.1 to 3 seconds and consists of the same flow rate of inert gas that is used in step 52. Optionally, as described in the first embodiment, a sequence of steps in the order 53, 54, 51, 52 may be performed to form a metal nitride monolayer in opening 13. In this case, a monolayer of nitrogen containing reactant 36 is left on the substrate after steps 51, 52 and the metal precursor 34 introduced in step 53 reacts with the monolayer of nitrogen containing reactant 36 to form a metal nitride monolayer 37. Step 54 purges any unreacted metal precursor 34.

In step 55 shown in FIG. 5, a silicon source gas is introduced into the ALD process chamber. The gas is preferably $SiH_4$ which is fed into the ALD process chamber at the same temperature and pressure conditions set in step 50. Preferably, the flow rate of silane is from 500 to 10000 sccm for a period of 0.1 to 3 seconds. The silane may be mixed with an inert gas as it is introduced into the chamber. Step 55 is followed by a purge step 56 that is performed with the same inert gas flow rate and duration as stated for purge steps 52, 54. Optionally, a boron source gas such as $B_2H_6$ may be used in place of a silicon source gas.

Figure 4D:
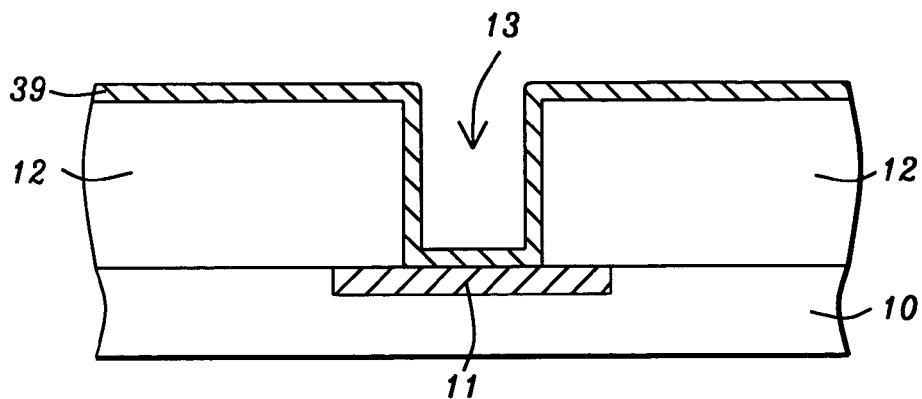

Referring again to FIG. 4c, a silane source gas 38 is introduced into the ALD process chamber and reacts with the metal nitride monolayer 37. As shown in FIG. 4d, the product of this reaction is a MSiN monolayer 39 where M is preferably Ti or Ta and which forms a conformal coating on dielectric layer 12 and on conductive layer 11 that is exposed by contact hole 13. An inert gas purge (step 56) insures that no unreacted silane source gas remains on substrate 30 after the MSiN monolayer is formed. In an alternative embodiment, a MBN monolayer 39 is formed by the reaction of the boron source gas with metal nitride monolayer 37. In subsequent cycles after the first cycle, a MSiN monolayer 39 is formed on a previously deposited MSiN monolayer or a MBN monolayer 39 is formed on a previously deposited MBN monolayer.

Figure 4E:
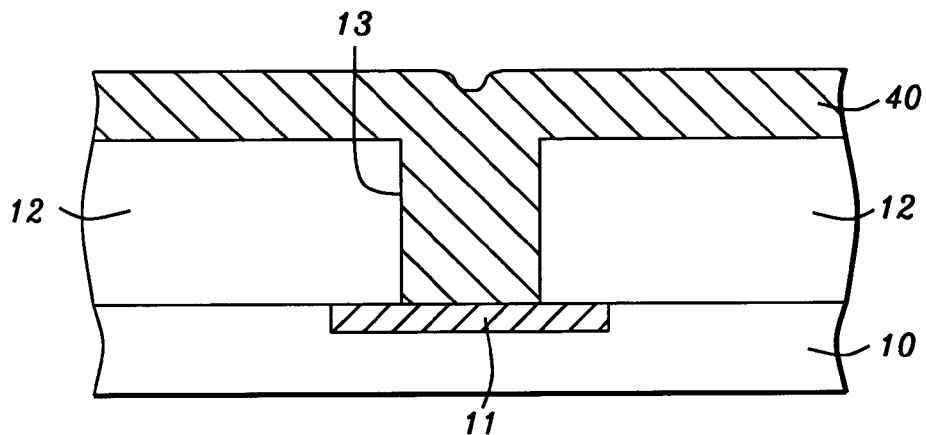

The sequence of steps 51, 52, 53, 54, 55, 56 or the sequence of steps 53, 54, 51, 52, 55, 56 is called a cycle and is repeated as many times as necessary in order to achieve the desired thickness of a $M_VS_XN_Z$ composite layer 40 to fill contact hole 13 as depicted in FIG. 4e. Note that v, x, and z in the $M_VS_XN_Z$ composite layer 40 are fractions between 0 and 1 which together equal 1, S is Si or B, and M is Ta, Ti, or W. Hundreds of cycles may be required since each cycle accounts for only a monolayer of MSiN thickness. For example, if the opening 13 has a width of 90 nm, then the sequence of steps 51, 52, 53, 54, 55, 56 are repeated until a 45 nm thick MSiN film 40 is deposited. The thickness of an $M_VS_XN_Z$ composite layer 40 may be determined by a top-down measurement tool such as XRF that is available from Rigaku Company. Optionally, a predetermined number of cycles are performed that deposit a known thickness of an $M_VS_XN_Z$ composite layer 40. A computer which controls the ALD process chamber tracks the progress of the ALD process by recording the number of cycles performed and terminates the deposition after a predetermined number of cycles are completed. In this case, a thickness measurement of composite layer 40 may not have to be taken.

In another embodiment, a plurality of cycles that deposit a $M_VS_XN_Z$ composite layer 40 is comprised of one or more cycles that form a MSN monolayer and one or more cycles that form a MS or MN monolayer in any predetermined order. Therefore, the sequence of steps 51, 52, 53, 54 that form a MN monolayer is also considered a cycle in the second embodiment of the present invention. Moreover, the sequence of steps 51, 52, 55, 56 that deposits a MS monolayer is considered one cycle.

Returning to FIG. 5, step 57 involves a film thickness measurement that may occur after a certain number of cycles are completed. In a manufacturing process, the MSN deposition rate is typically well known and a film thickness measurement may be taken after a predetermined number of cycles that are expected to provide the correct thickness. If the film thickness measurement indicates that the $M_VS_XN_Z$ composite layer 40 is too thin, then one or more of the sequences (51, 52, 53, 54, 55, 56), (53, 54, 51, 52, 55, 56), (51, 52, 53, 54), and (51, 52, 55, 56) are repeated one or more times and a second measurement (step 57) is performed to verify that the $M_VS_XN_Z$ composite layer 40 has an acceptable thickness.

Once a $M_VS_XN_Z$ composite layer 40 has an appropriate thickness as determined by a film thickness measurement or by recording the number of cycles performed using a computer linked to the ALD process chamber, the ALD process moves to step 58 (FIG. 5) in which the ALD process chamber is returned to room temperature and atmospheric pressure. The substrate 10 is removed and the ALD process is concluded. As shown in FIG. 4e, a $M_VS_XN_Z$ composite layer 40 is formed that does not have any voids and is completely conformal with the surface of dielectric layer 12 and opening 13. A small dip in the $M_VS_XN_Z$ composite layer 40 above the center of the opening 13 does not affect device performance since it is removed in a subsequent step. This ALD technique is preferred over CVD or PECVD methods since a precise stoichiometry is achieved in the $M_VS_XN_Z$ composite layer 40 with a reduced amount of impurities that improves device performance. Moreover, the need for two or three different materials to form a plug in opening 13 is avoided which reduces process complexity and cost.

There is increased versatility in the ALD method of the second embodiment since the composition of $M_VS_XN_Z$ composite layer 40 may be varied to optimize a particular property. For example, N content might be lowered to improve resistivity. When $M_VS_XN_Z$ composite layer 40 is TiSiN or TaSiN, the preferred composition is v=0.5, x=0.005 to 0.15, and z=0.05 to 0.4. Furthermore, the ALD method of the present invention is preferred over prior art ALD techniques because it avoids the use of hazardous titanium nitrate precursors and does not require a metal chloride that could result in chloride contamination.

Figure 4F:
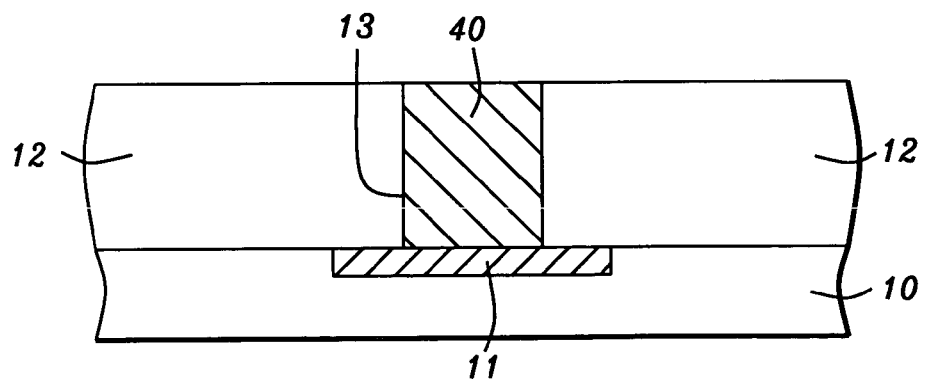

Referring to FIG. 4f, the level of $M_VS_XN_Z$ composite layer 40 is lowered until it is coplanar with dielectric layer 12 and forms a $M_VS_XN_Z$ composite plug 40 which is an interconnect. A planarization method such as a CMP step may be employed. Optionally, the $M_VS_XN_Z$ composite layer 40 may be etched back by a plasma etch process that consists of the following conditions: a gas mixture comprised of $Cl_2$; $BCl_3$ and Ar, each with a 10 to 100 sccm flow rate, a chamber pressure of about 1 to 50 Torr, a chamber temperature of 20° C. to 100° C., a RF power of from 100 to 2000 Watts for a period of about 5 to 60 seconds. Other gas mixtures may be used depending on the composition of the $M_VS_XN_Z$ composite layer 40.

A $M_VS_XN_Z$ interconnect such as TiSiN or TaSiN is therefore constructed which is cost effective since the deposition involves only a single ALD process. Less rework is required than in the case of a two or three step CVD or PECVD deposition where metal adhesion is a concern and a keyhole is likely to form in the center of the plug. Furthermore, step coverage is improved in an ALD process compared to a conventional W plug process that has a barrier layer formed by a CVD method and nucleation layer as illustrated in FIG. 1a.

In a third embodiment, an ALD process is employed that deposits a composite layer comprised of a plurality of monolayers which include more than three elements. In one aspect, the composite layer has the formula $M_VSi_XB_YN_Z$ where M is a metal and v, x, y, and z are fractions between 0 and 1 which together equal 1. For example, the composite layer 40 in FIG. 4e may be further comprised of a fourth element. In the third embodiment, the composite layer 40 is a plurality of monolayers comprised of one or more monolayers of MSiN or MSi and one or more monolayers of MBN or MB that are formed by sequences of steps (51, 52, 53, 54, 55, 56), (53, 54, 51, 52, 55, 56), and (51, 52, 55, 56) as described previously. During at least one of the cycles that include a step 55 in FIG. 5, a silicon source gas is flowed into the chamber to form a monolayer of MSiN or MSi and during at least one of the cycles that include a step 55, a boron source gas is flowed into the chamber to form a monolayer of MBN or MB. Optionally, the composite layer 40 may be comprised of one or more MN monolayers that are formed by one or more cycles comprised of the sequence of steps 53, 54, 51, 52 or the sequence of steps 51, 52, 53, 54. The composite layer 40 is formed by performing a plurality of cycles in a predetermined order to give an acceptable thickness that fills an opening 13 in dielectric layer 12 on a substrate 10.

In another aspect, the composite layer of the third embodiment has the formula $M_{1V}M_{2W}S_XN_Z$ where v, w, x, and z are fractions between 0 and 1 and which together equal 1, $M_1$ is a first metal, $M_2$ is a second metal, and S is Si or B. For example, the composite layer 40 in FIG. 4e may be further comprised of a fourth element that is a second metal. The composite layer 40 is a plurality of monolayers comprised of one or more monolayers of $M_1$ SN and one or more monolayers of $M_2$SN that are formed by the sequences of steps (51, 52, 53, 54, 55, 56) and (53, 54, 51, 52, 55, 56). During at least one of the cycles that include a step 51, a first metal ($M_1$) gas precursor is flowed into the chamber and during at least one of the cycles that include a step 51, a second metal ($M_2$) gas precursor is flowed into the chamber. For example, $Ti\{OCH(CH_3)_2\}_4$ may be flowed into the chamber during one cycle to form a monolayer of TiSiN and TBTDET may be flowed into the chamber during a second cycle to form a monolayer of TaSiN. Optionally, the composite layer 40 may be comprised of additional monolayers which are $M_1S$, $M_2S$, $M_1N$ and $M_2N$ that are formed by the sequences (51, 52, 55, 56), (53, 54, 51, 52), and (51, 52, 53, 54) in which step 51 may involve either a first metal ($M_1$) precursor or a second metal ($M_2$) precursor. The monolayers are deposited in a predetermined order to give an acceptable thickness of the composite layer 40 that fills an opening 13 in dielectric layer 12 on a substrate 10.

A subsequent planarization step which may be a CMP step or an etch step is used to lower the level of composite layer 40 to form a plug 40 in opening 13 as depicted in FIG. 4f. The method of the third embodiment provides the highest degree of versatility in optimizing properties of the composite layer 40 such as adhesion to dielectric layer 12 and resistivity in the resulting interconnect.

Those skilled in the art will appreciate that other multi-element compositions may be deposited by an ALD technique of the third embodiment. Examples of alternative multi-element compositions are described in the related application TSMC01-1248 which is herein incorporated by reference.

While this invention has been particularly shown and described with reference to, the preferred embodiments thereof, it will be understood by those skilled in the art that various changes in form and details may be made without departing from the spirit and scope of this invention.

We claim:

1. An atomic layer deposition (ALD) process for depositing a metal nitride layer comprised of a plurality of metal nitride monolayers on a substrate, comprising:
    (a) providing a substrate with a patterned layer formed thereon, the patterned layer comprising an opening;
    (b) loading the substrate in an ALD process chamber and adjusting the temperature and pressure in said ALD process chamber to acceptable levels;
    (c) flowing a nitrogen containing reactant into said ALD process chamber so that said nitrogen containing reactant is deposited on said substrate;
    (d) purging said ALD process chamber with an inert gas to leave a monolayer of nitrogen containing reactant on said substrate;
    (e) flowing a metal precursor into said ALD process chamber, said metal precursor reacts with said nitrogen containing reactant monolayer to form a metal nitride monolayer wherein the metal precursor comprises at least one of $Ti\{OCH(CH_3)_2\}_4$, and TDEAT;
    (f) purging said ALD process chamber to remove unreacted metal precursor; and
    (g) repeating the sequence of steps (c), (d), (e), (f) until the metal nitride layer fills the opening to form a metal nitride plug.

2. The method of claim 1 wherein the temperature of said ALD process chamber is between about 250° C. and 750° C. and the pressure in said ALD process chamber is maintained in a range from about 0.1 to 50 Torr.

3. The method of claim 1 wherein said metal precursor is flowed into said ALD process chamber at a rate of about 500 to 10000 standard centimeters per minute (sccm) for a period of about 0.1 to 3 seconds.

4. The method of claim 1 wherein said metal precursor gas is transported into said ALD process chamber by an inert gas having a flow rate of about 500 to 10000 sccm.

5. The method of claim 1 wherein the inert gas purging of said ALD process chamber is comprised of flowing argon, helium, or $N_2$ with a flow rate from about 500 to 10000 sccm for a period of about 0.1 to 10 seconds.

6. The method of claim 1 wherein the nitrogen containing reactant is comprised of $NH_3$, $N_2H_4$, or $N_2$ and is flowed at a rate of about 500 to 10000 sccm for a period of about 0.1 to 3 seconds.

7. The method of claim 6 further comprised of a generating a plasma to assist in the reaction between the nitrogen containing reactant and the metal precursor.

8. The method of claim 1 wherein the film thickness of the metal nitride layer is between 0 and about 50 nm.

9. An atomic layer deposition (ALD) process for depositing a metal nitride layer comprised of a plurality of metal nitride monolayers on a substrate, comprising:
    (a) providing a substrate with a patterned layer formed thereon, the patterned layer comprises an opening;

(b) loading the substrate in an ALD process chamber and adjusting the temperature and pressure in said ALD process chamber to acceptable levels;

(c) flowing a metal precursor into said ALD process chamber so that said metal precursor is deposited on said substrate, wherein said metal precursor comprises at least one of $Ti\{OCH(CH_3)_2\}_4$, and TDEAT;

(d) purging said ALD process chamber with an inert gas to leave a monolayer of metal precursor on said substrate;

(e) flowing a nitrogen containing reactant into said ALD process chamber, said nitrogen containing reactant reacts with said metal precursor monolayer to form a metal nitride monolayer;

(f) purging said ALD process chamber to remove unreacted nitrogen containing reactant; and (g) repeating the sequence of steps (c), (d), (e), (f) until the metal nitride layer fills the opening to form a metal nitride plug.

10. A method of forming a metal nitride layer on a substrate, said substrate comprised of an upper dielectric layer having at least one opening, comprising:

(a) providing a substrate having an upper dielectric layer that has a pattern formed therein comprised of at least one opening;

(b) loading the substrate in an ALD process chamber and adjusting the temperature and pressure in said ALD process chamber to acceptable levels;

(c) flowing a metal precursor into said ALD process chamber so that said metal precursor is deposited on said substrate, wherein said metal precursor comprises at least one of $Ti\{OCH(CH_3)_2\}_4$, and TDEAT;

(d) purging said chamber with an inert gas to leave a monolayer of metal precursor on said substrate;

(e) flowing a nitrogen containing reactant into said ALD process chamber, said nitrogen containing reactant reacts with said metal precursor monolayer to give a metal nitride monolayer on said substrate;

(f) purging said ALD process chamber to remove unreacted nitrogen containing reactant;

(g) repeating the sequence of steps (c), (d), (e), (f) to deposit a plurality of metal nitride monolayers which form a composite layer that fills said opening to form a metal nitride plug; and (h) planarizing said composite layer to be coplanar with said dielectric layer.

11. The method of claim 10 wherein said dielectric layer is phosphosilicate glass (PSG), borophosphosilicate glass (BPSG), or a low k dielectric material with a thickness between about 1000 and 10000 Angstroms.

12. The method of claim 10 wherein said opening is a contact hole, via, or trench and has a width that is about 100 nm or less.

13. The method of claim 10 wherein the temperature of said ALD process chamber is between about 250° C. and 750° C. and the pressure in said ALD process chamber is maintained in a range from about 0.1 to 50 Torr.

14. The method of claim 10 wherein said metal precursor is flowed at a rate of about 500 to 10000 sccm for a period of about 0.1 to 3 seconds.

15. The method of claim 10 wherein said metal precursor is transported into the ALD process chamber by an inert gas having a flow rate of about 500 to 10000 sccm.

16. The method of claim 10 wherein the inert gas purging of said ALD process chamber is comprised of flowing argon, helium, or $N_2$ with a flow rate from about 500 to 10000 sccm for a period of about 0.1 to 10 seconds.

17. The method of claim 10 wherein the nitrogen containing reactant is comprised of $NH_3$, $N_2H_4$, or $N_2$ and is flowed at a rate of about 500 to 10000 sccm for a period of about 0.1 to 3 seconds.

18. The method of claim 17 further comprised of a generating a plasma to assist in the reaction between the nitrogen containing reactant and the metal precursor.

19. The method of claim 10 further comprised of performing a film thickness measurement after several repetitions of the sequence of steps (c), (d), (e), (f) to determine if an acceptable thickness of said composite layer has been achieved.

20. The method of claim 10 wherein said planarization is performed with a chemical mechanical polish (CMP) step.

21. A method for forming an interconnect:

providing a substrate;

forming a conductive layer within the substate;

depositing a dielectric layer on the substate;

forming an opening within the dielectric layer;

depositing a titanium-containing composite layer on the substrate to fill the opening; and planarizing the titanium-containing composite layer to be coplanar with the dielectric layer, wherein depositing the titanium-containing composite layer comprises flowing a metal precursor that comprises at least one of $Ti\{OCH(CH_3)_2\}_4$, and TDEAT into a chamber, wherein depositing a composite layer on the substrate further comprises:

purging an inert gas into the chamber to remove metal precursor not bonded to the substrate;

flowing a nitrogen-containing reactant into the chamber to form one of the plurality of metal nitride monolayer; and purging an inert gas into the chamber to remove nitrogen-containing reactant not reacted with the mental precursor, and wherein the purging step for purging an inert gas to remove metal precursor not bonded to the substrate, the flowing step for flowing a nitrogen-containing reactant into the chamber to form one of the plurality of metal nitride monolayer, and the purging step for purging an inert gas into the chamber to remove nitrogen-containing reactant not reached with the metal precursor are performed repeatedly until the composite layer fills the opening to form a titanium-containing composite plug.

22. The method of claim 21, wherein the composite layer comprises a plurality of metal nitride monolayers.

23. The method of claim 22, wherein each of the plurality of metal nitride monolayers comprises at least one metal and nitrogen.

* * * * *